United States Patent
Hsu (10) Patent No.: US 8,878,210 B2
(45) Date of Patent: Nov. 4, 2014

(54) LIGHT-EMITTING DEVICE

(71) Applicant: Epistar Corporation, Hsinchu (TW)

(72) Inventor: Tzu-Chieh Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/862,022

(22) Filed: Apr. 12, 2013

(65) Prior Publication Data

US 2013/0221391 A1     Aug. 29, 2013

Related U.S. Application Data

(63) Continuation-in-part of application No. 12/824,422, filed on Jun. 28, 2010, now Pat. No. 8,420,418.

(30) Foreign Application Priority Data

Jul. 1, 2009   (TW) ................. 98122355 A (51) Int. Cl.
| | |
|---|---|
| H01L 33/00 | (2010.01) |
| H01L 33/22 | (2010.01) |
| H01L 21/683 | (2006.01) |
| H01L 23/00 | (2006.01) |
| H01L 33/20 | (2010.01) |

(52) U.S. Cl.
CPC ............ *H01L 33/22* (2013.01); *H01L 24/29* (2013.01); *H01L 2924/014* (2013.01); *H01L 21/6835* (2013.01); *H01L 24/48* (2013.01); *H01L 2221/68359* (2013.01); *H01L 2224/48091* (2013.01); *H01L 2224/48227* (2013.01); *H01L 24/97* (2013.01); *H01L 2224/73265* (2013.01); *H01L 2924/12041* (2013.01); *H01L 33/0079* (2013.01); *H01L 33/20* (2013.01)
USPC .. 257/95; 257/98; 257/E33.067; 257/E33.074

(58) Field of Classification Search
CPC ........ H01L 33/20; H01L 33/22; H01L 33/007; H01L 33/0079; H01L 51/5268
USPC .................... 257/95, 98, E33.067, E33.074
See application file for complete search history.

(56) References Cited

U.S. PATENT DOCUMENTS

| | | | |
|---|---|---|---|
| 6,700,139 B2 * | 3/2004 | Suzuki et al. ................. 257/103 |
| 7,015,054 B2 * | 3/2006 | Steigerwald et al. ........... 438/22 |
| 7,745,240 B2 * | 6/2010 | Furuya ............................ 438/22 |
| 2004/0026700 A1 * | 2/2004 | Akaike et al. ................... 257/79 |
| 2005/0186760 A1 | 8/2005 | Hashimura et al. |
| 2007/0176181 A1 * | 8/2007 | Kusunoki ........................ 257/79 |
| 2008/0258165 A1 | 10/2008 | Zimmerman et al. |
| 2010/0099212 A1 | 4/2010 | Yang et al. |
| 2010/0200885 A1 | 8/2010 | Hsu et al. |
| 2010/0314633 A1 * | 12/2010 | Donofrio et al. ................ 257/88 |

FOREIGN PATENT DOCUMENTS

| | | |
|---|---|---|
| CN | 101106103 A | 1/2008 |
| TW | 561632 B | 11/2003 |
| TW | 200805718 A | 1/2008 |
| TW | 200908399 A | 2/2009 |

* cited by examiner

*Primary Examiner* — Minh-Loan T Tran
(74) *Attorney, Agent, or Firm* — Patterson & Sheridan, LLP (57) ABSTRACT

A light emitting device comprising: a substrate, wherein the substrate comprises a first major surface, a second major surface opposite to the first major surface, and a sidewall wherein the entire sidewall is a substantially textured surface with a depth of 10~150 μm; and a light emitting stack layer formed on the substrate.

19 Claims, 10 Drawing Sheets

LIGHT-EMITTING DEVICE

RELATED APPLICATION

This application is a continuation-in-part of U.S. patent application Ser. No. 12/824,422, entitled "LIGHT-EMITTING DEVICE AND MANUFACTURING METHOD THEREOF", filed Jun. 28, 2010, which claims benefit to Taiwan Patent Application Serial No. 098122355, filed Jul. 1, 2009, the contents of which are hereby incorporated by reference in their entireties.

BACKGROUND

1. Technical Field

The present disclosure disclosed a light emitting device which is especially related to the sidewall of the substrate of the light emitting device.

2. Description of the Related Art

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as a new light source for the illumination markets. The LED applies to various applications like the traffic signal, backlight module, street light, and medical instruments, and is gradually replacing the traditional lighting sources.

Figure 1:
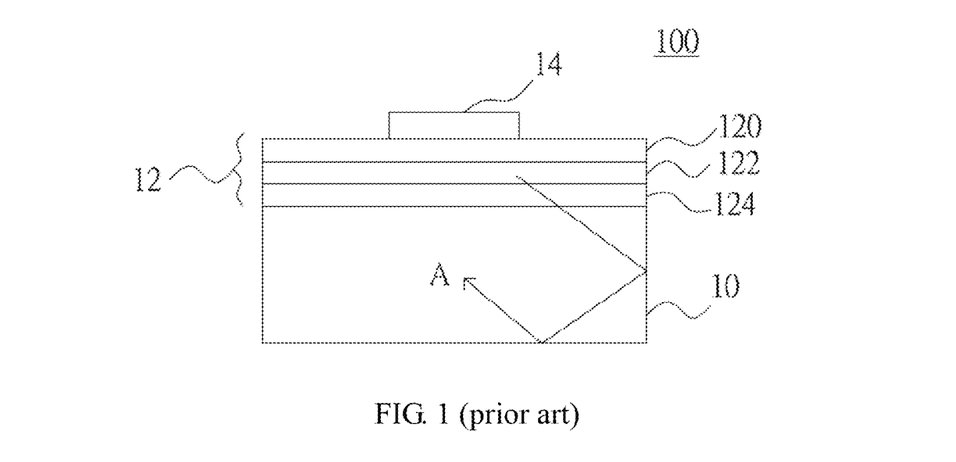
FIG. 1 illustrates the structure of a conventional light emitting device.

FIG. 1 illustrates the structure of a conventional light emitting device 100 which includes a transparent substrate 10, a semiconductor stack layer 12 formed above the transparent substrate 10, and an electrode 14 formed above the semiconductor stack layer 12, wherein the semiconductor stack layer 12 comprises, from the top, a first conductive-type semiconductor layer 120, an active layer 122, and a second conductive-type semiconductor layer 124.

Figure 2:
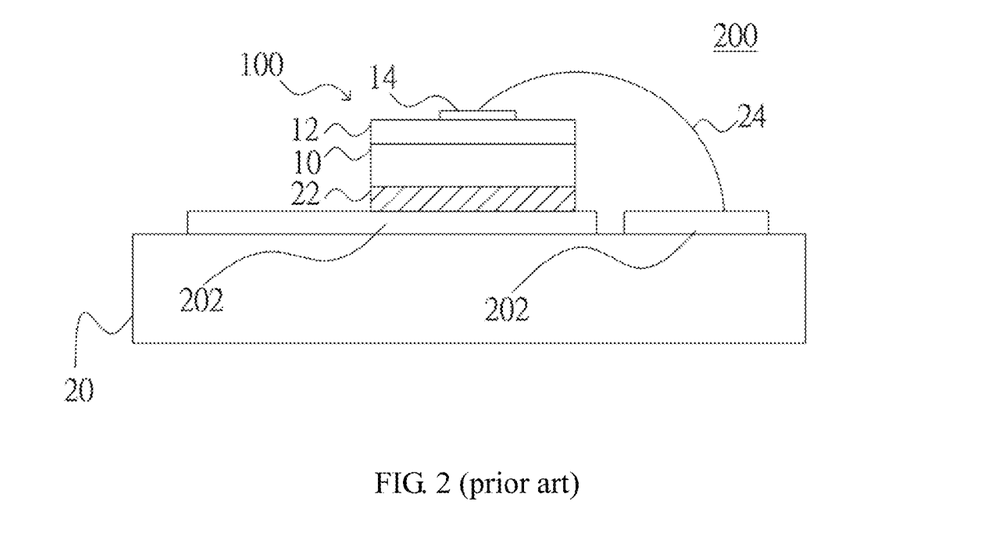
FIG. 2 illustrates the structure of a conventional light emitting apparatus.

In addition, the light emitting device 100 can be further connected to other components in order to form a light emitting apparatus. FIG. 2 illustrates a conventional light emitting apparatus including a sub-mount 20 carrying an electrical circuit 202, a solder 22 formed above the sub-mount 20; wherein the light emitting device 100 is bonded to the sub-mount 20 and is electrically connected with the electrical circuit 202 on the sub-mount 20 by the solder 22, and an electric connection structure 24 that electrically connects the electrode 14 of the light emitting device 100 to the electrical circuit 202 on the sub-mount 20. The sub-mount 20 may be a lead frame or a large size mounting substrate in order to facilitate circuit design and enhance heat dissipation.

Nevertheless, because the surface of the transparent substrate 10 of the conventional light emitting device 100 as shown in FIG. 1 is substantially flat and the refractive index of the transparent substrate 10 is different from the refractive index of the external environment, the total internal reflection (TIR) occurs when a light A emitted from the active layer 122. Therefore the light extraction efficiency from the light emitting device 100 is reduced drastically.

SUMMARY OF THE DISCLOSURE

The present disclosure provides a light emitting device comprising: a substrate, wherein the substrate comprises a first major surface, a second major surface opposite to the first major surface, and a sidewall wherein the entire sidewall is a substantially textured surface with a depth of 10~150 μm; and a light emitting stack layer formed on the substrate.

BRIEF DESCRIPTION OF DRAWINGS

The accompanying drawings are included to provide easy understanding of the application, and are incorporated herein and constitute a part of this specification. The drawings illustrate embodiments of the application and, together with the description, serve to illustrate the principles of the application.

FIGS. 3A to 3M illustrate a process flow of a method of fabricating a light emitting device in the present disclosure.

DETAILED DESCRIPTION OF THE PREFERRED EMBODIMENTS

Reference is made in detail to the preferred embodiments of the present application, examples of which are illustrated in the accompanying drawings. Wherever possible, the same reference numbers are used in the drawings and the description to refer to the same or like parts.

The present disclosure describes a light emitting device and a method of fabricating the light emitting device. In order to have a thorough understanding of the present disclosure, please refer to the following description and the illustrations of FIG. 3A to FIG. 5.

Figure 3A:
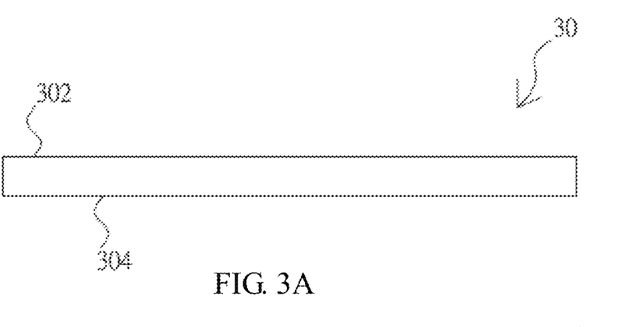

FIGS. 3A to 3M illustrate a process flow of the method of fabricating the light emitting device of one embodiment of the present disclosure. FIG. 3A shows a substrate 30 including a first major surface 302 and a second major surface 304 wherein the first major surface 302 is opposite to the second major surface 304.

Figure 3B:
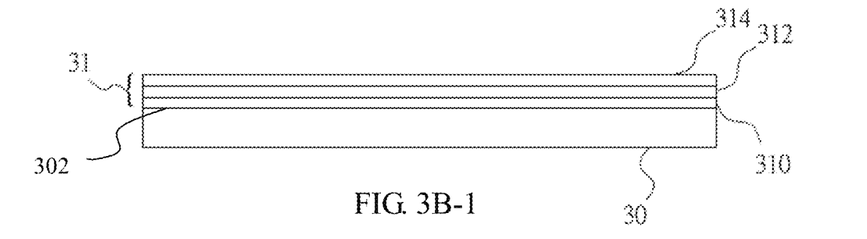
Figure 3B:
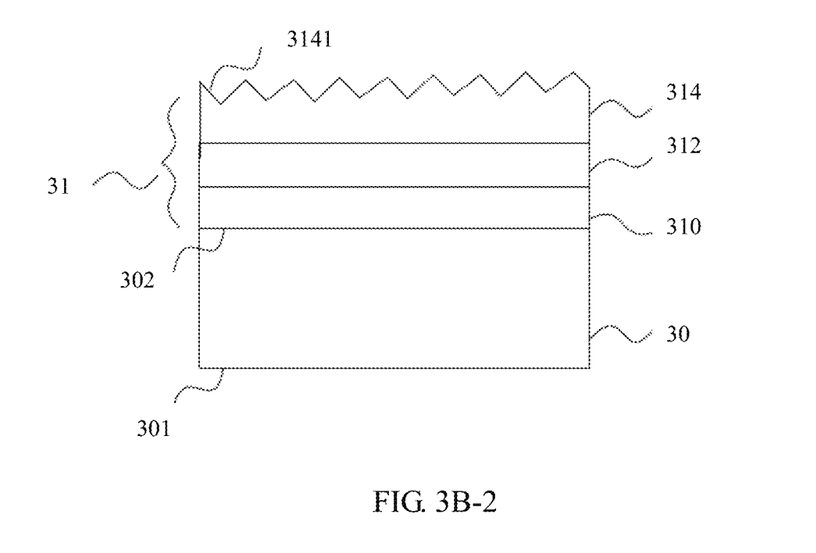
Figure 3B:
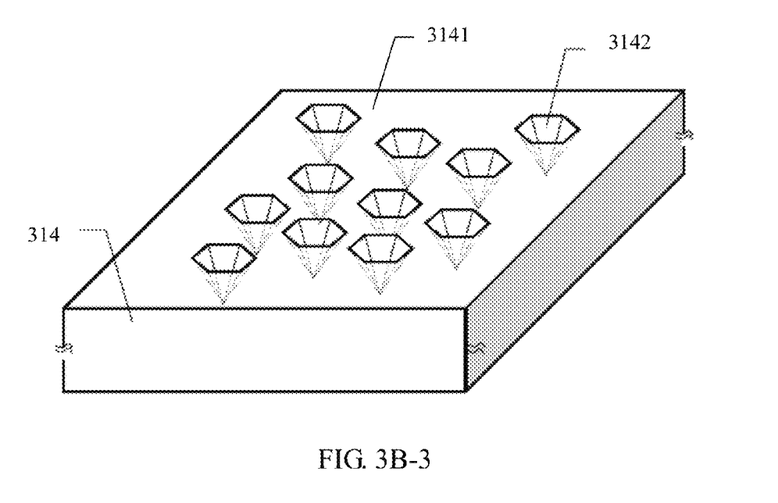
Figure 3B:
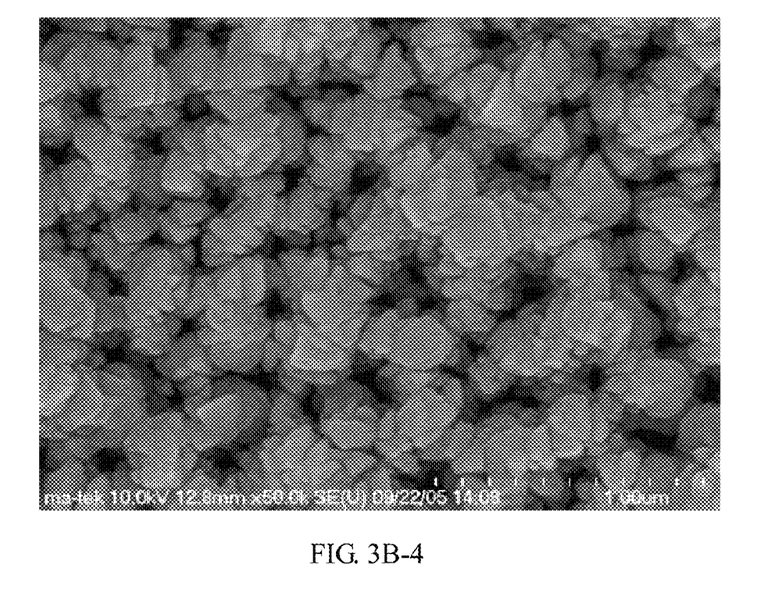

FIG. 3B-1 shows a stack of semiconductor epitaxial layers 31 formed on the first major surface 302 of the substrate 30, wherein the semiconductor epitaxial layer 31 includes, a first conductive-type semiconductor layer 310, an active layer 312, and a second conductive-type semiconductor layer 314 formed on the first major surface 302 of the substrate 30. As FIG. 3B-2 illustrates, in one embodiment, the upper surface 3141 of the second conductivity type semiconductor layer 314 has a textured surface formed by an epitaxy method, an etching method, or the combination thereof.

In one embodiment, as FIGS. 3B-3~3B-4 illustrates, the textured surface includes a plurality of cavities 3142 that is shaped into cones or pyramids wherein the direction of the extension of the plurality of cavities is perpendicular to the upper surface 3141 of the second conductivity type semiconductor layer 314.

Figure 3C:
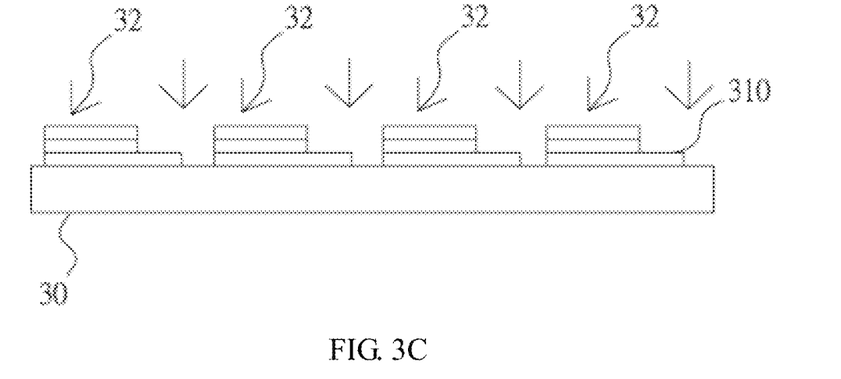
Figure 3D:
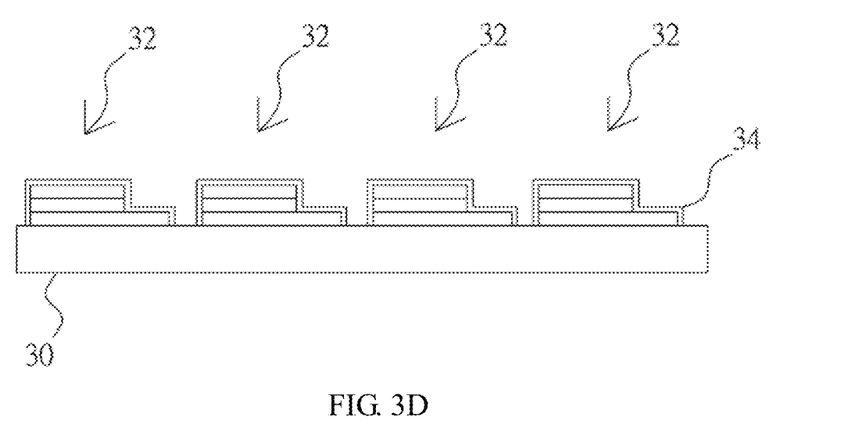

FIG. 3C illustrates a further step by employing photolithography and etching process to etch the semiconductor epitaxial layer 31 in order to expose a portion of the substrate 30 to form a plurality of light emitting stack layers 32 shaped in mesa wherein a portion of the first conductive-type semiconductor layer 310 of each light emitting stack layer 32 is exposed. FIG. 3D shows forming an etching protection layer 34 on the top of the light emitting stack layer 32, wherein the etching protection layer 34 may be formed simultaneously on the top of the light emitting stack layer 32 and the substrate 30 in other embodiments. The material of the etching protection layer 34 can be $SiO_2$ or $SiN_x$.

Figure 3E:
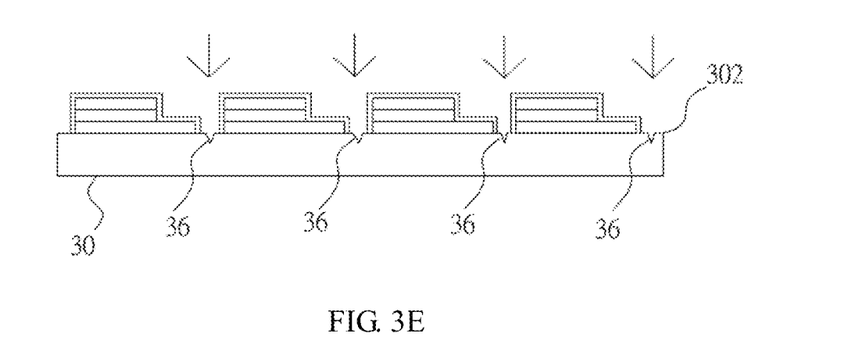

FIG. 3E shows a step by using a laser beam with the energy of 0.3~0.6 W and the speed of 2~8 mm/sec. to form a plurality of discontinuous holes or continuous lines 36 on the first major surface 302 of the substrate 30. The depth of the plurality of discontinuous holes or continuous lines 36 can be 10~150 µm. In another embodiment of the present disclosure, the depth of the plurality of discontinuous holes or continuous lines 36 can be 50~150 µm.

Figure 3F:
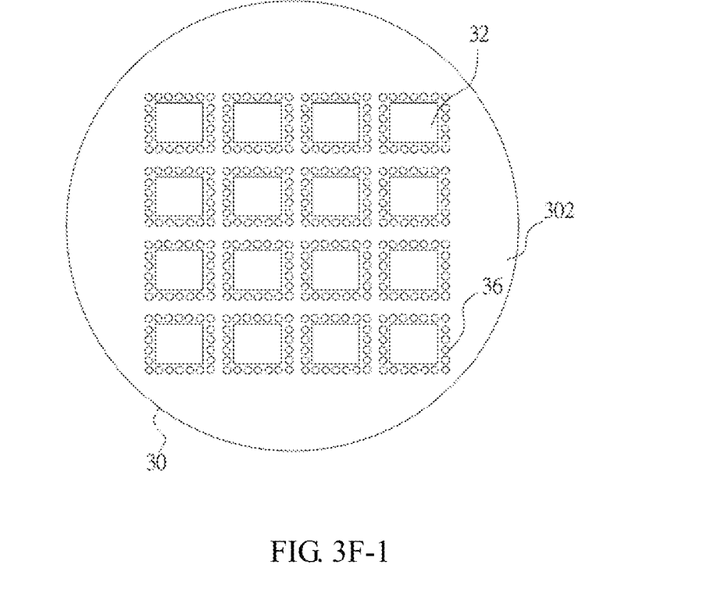
Figure 3F:
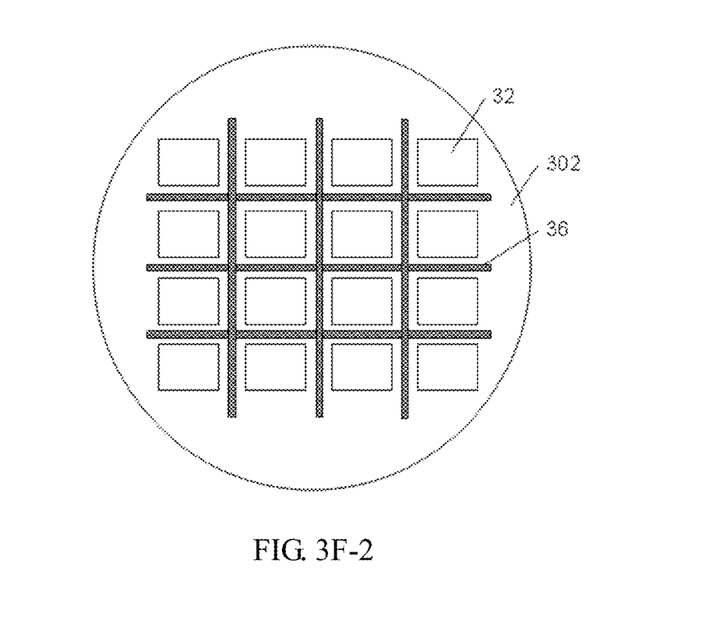

FIGS. 3F-1 and 3F-2 are top views of FIG. 3E. Viewing from FIG. 3E and FIG. 3F-1, the plurality of light emitting stack layers 32 is surrounded by the discontinuous holes 36 formed by the laser beam. In another embodiment of the present disclosure, as referring to FIG. 3F-2, the plurality of light emitting stack layers 32 is surrounded by the continuous lines 36 formed by the laser beam.

FIG. 3G indicates that the discontinuous holes or continuous lines 36 are etched by an etching solution in a temperature ranging from 100 to 300 degree Celsius (° C.) for about 10 to 50 minutes to remove the laser by-products. In the embodiment, a better operation condition is of a temperature between 150 to 250° C. and an etching duration for about 20 to 40 minutes by an etching solution containing $H_2SO_4$ and $H_3PO_4$, in which the concentration ratio is about 3:1. In another embodiment, the etching solution can be only phosphoric acid.

Figure 3H:
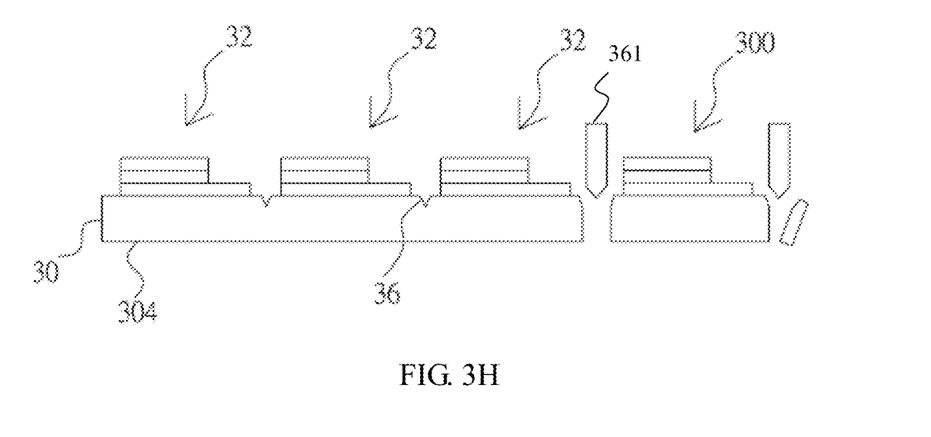

In FIG. 3H, the etching protection layer 34 is removed, and a grinding process is performed on the second major surface 304 of the substrate 30 in order to reduce the thickness of substrate 30. Thereafter, a plurality of light emitting devices 300 is fabricated by cleaving the substrate 30 through the plurality of discontinuous holes or continuous lines 36.

Figure 3I:
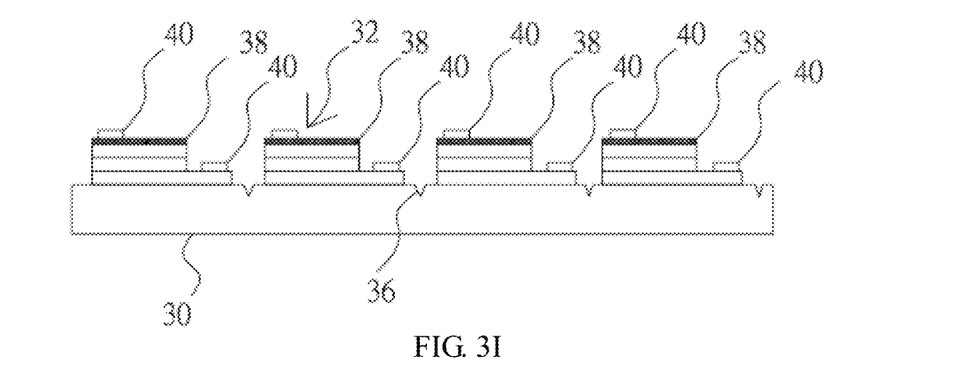

As shown in FIG. 3I, before the cleaving process, the light emitting device 300 further comprises a transparent conductive oxide (TCO) layer 38 formed on the light emitting stack layer 32 and an electrode 40 formed on the TCO layer 38.

What the above embodiments describe about forming the discontinuous holes or continuous lines 36 on the first major surface 302 of the substrate 30 by the laser beam is only for examples and should not be limited to these embodiments; it will also be appreciated by those having ordinary skill in the art that references to the cleaving can be made through other locations by a laser beam, such as on the second major surface 304 of the substrate 30 to form a plurality of discontinuous holes or continuous lines 36 on the second major surface 304.

Figure 3J:
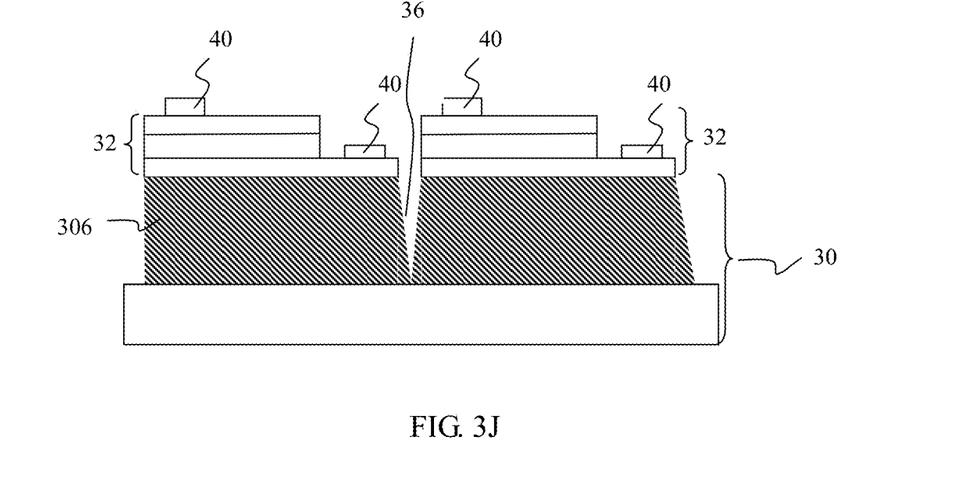
Figure 3K:
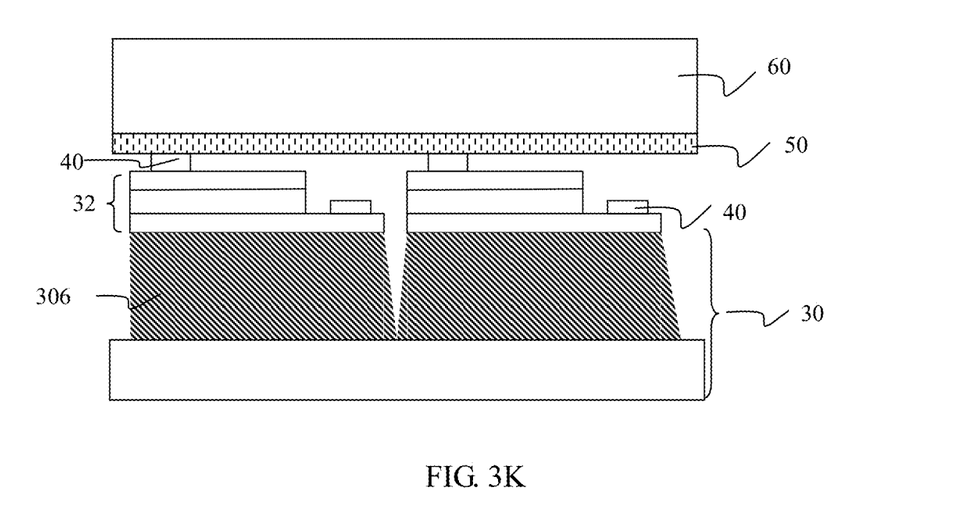

In another embodiment of the present disclosure, as FIG. 3J shows which follows the process shown in FIG. 3G, after removing the etching protection layer 34, at least one electrode 40 is formed on the light emitting stack layer 32. In this embodiment, the light emitting stack layer 32 is formed on the substrate 30 wherein partial of the sidewall 306 of the substrate 30 is substantially textured. In a preferred embodiment, the thickness of the substantially textured region of the sidewall 306 is preferably about the same with the depth of the discontinuous holes or continuous lines 36. As shown in FIG. 3K, the plurality of light emitting stack layer 32 can be connected to a temporary substrate 60 by a connecting layer 50. In this embodiment, the material of the connecting layer 50 comprises at least one material selected from the group consisting of polyimide (PI), Benzocyclobutene (BCB), and perfluorocyclobutane (PFCB); or metal material. The material of the temporary substrate 60 can be sapphire, SiC, ZnO or GaN.

Figure 3L:
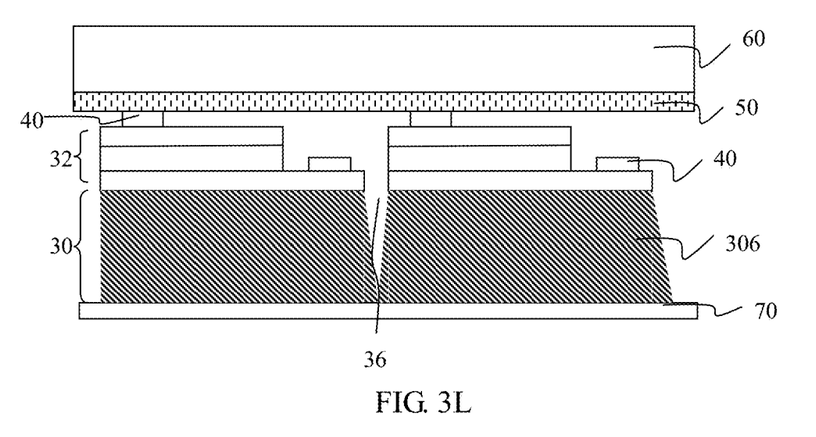

Following, as shown in FIG. 3L, a grinding process is performed on the second major surface 304 in order to reduce the thickness of the substrate 30 to about reveal the discontinuous holes or continuous lines 36. Thereafter, an expandable adhesion layer 70 is connected to the bottom of the substrate 30 with the sidewall 306 having a substantially textured region. The material of the adhesion layer 70 can be an expandable blue tape.

Figure 3M:
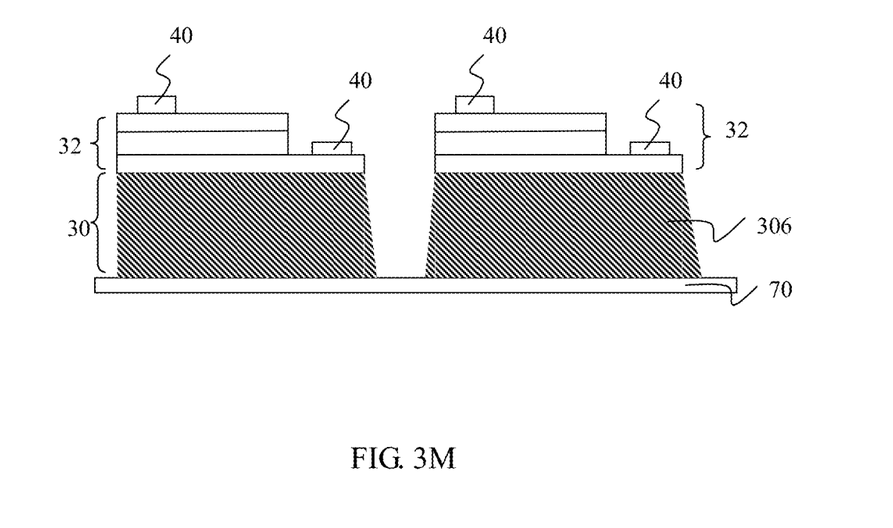

Following, as shown in FIG. 3M, the temporary substrate 60 and the connecting layer 50 can be removed by etching or laser lift off (LLO). Then the plurality of light emitting devices 300 formed on the adhesion layer 70 can be separated by expanding the adhesion layer 70. With the adhesion layer 70, the separated light emitting devices 300 do not spread out or get loose so the following process can be performed smoothly.

Figure 4A:
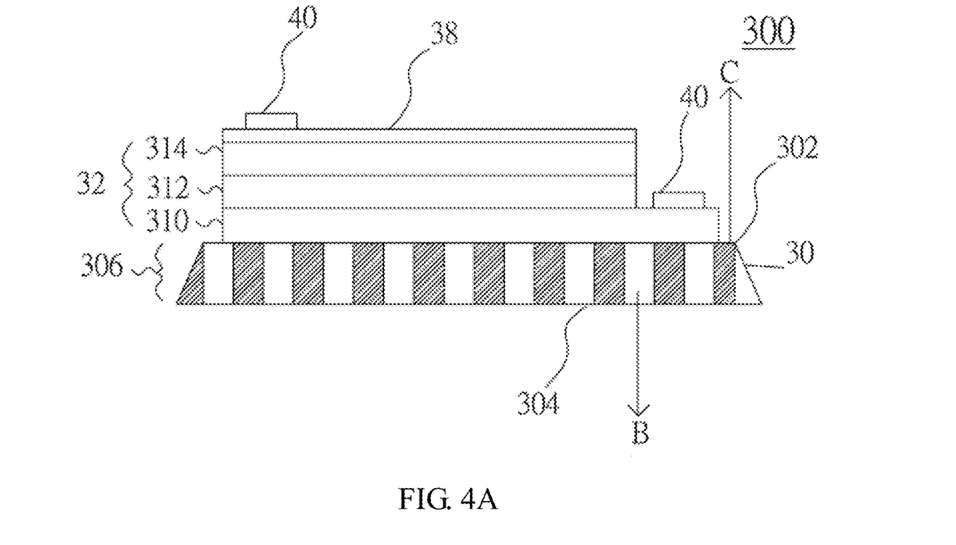
FIGS. 4A to 4B illustrate the structure of embodiments in the present disclosure.
Figure 4B:
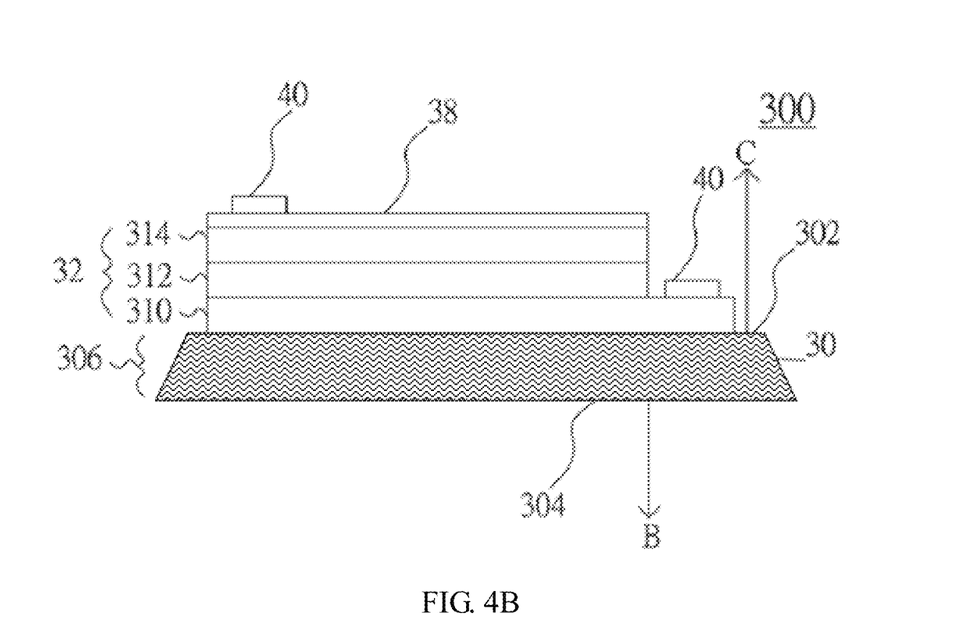

FIG. 4A to FIG. 4B illustrates the structure of embodiments in the present disclosure. As shown in FIG. 4A, the light emitting device 300 includes at least a substrate 30 and a light emitting stack layer 32 on the substrate 30. The substrate 30 includes at least a first major surface 302, a second major surface 304 and at least a sidewall 306 formed between the first major surface 302 and the second major surface 304 wherein partial of the sidewall 306 is substantially textured and the thickness of the substantially textured region of the sidewall is preferably about the same with the depth of the discontinuous holes or continuous lines 36, for example, about 10 µm to 150 µm. In a preferred embodiment, the thickness of the substantially textured region of the sidewall is about 50 µm to 150 µm. For the embodiment of the present disclosure, a convex-concave structure of the substantially textured region of the sidewall is formed by the laser beam and an etching process. An extension direction B of the convex-concave structure is longitudinal, wherein the extension direction B may be a direction originating from the first major surface 302 of the substrate 30 and heading away from the first major surface 302, or a direction originating from the second major surface 304 of the substrate 30 and heading away from the second major surface 304. The extension direction B may also be a direction originating from the first major surface 302 of the substrate 30 and heading toward the second major surface 304. The extension direction B forms an angle θ with the normal line C of the first major surface 302, herein 0°≤θ<90°. For the embodiments of the present disclosure, the extension direction B of the convex-concave structure is substantially parallel to the normal line C of the first major surface 302, i.e. θ is 0°.

As shown in FIG. 4B, the light emitting device 300 includes a substrate 30 and a light emitting stack layer 32 on the substrate 30. The substrate 30 includes a first major surface 302, a second major surface 304 and a sidewall 306 formed between the first major surface 302 and the second major surface 304 wherein partial of the sidewall 306 is substantially textured and the thickness of the substantially textured region of the sidewall is preferably about the same with the depth of the discontinuous holes or continuous lines 36, for example, 10 µm to 150 µm. In a preferred embodiment, the thickness of the substantially textured region of the sidewall is about 50 µm to 150 µm. For the embodiment of the present disclosure, the substantially textured region of the sidewall forms a continuous textured structure of by the laser beam and an etching process. In a preferred embodiment, the four sidewalls of the light emitting device 300 can be a substantially textured surface. In another preferred embodiment, besides the four sidewalls of the light emitting device 300, the first major surface of the light emitting device 300 can be a substantially textured surface as well, wherein the textured surface can be a roughed surface or a surface with patterns. The pattern of the textured surface can be a discontinuous holes, continuous lines, or convex-concave structure. The textured surface is formed by the laser beam and/or an etching process.

The material of the substrate 30 may be a transparent material like sapphire, ZnO or any other suitable materials. Embodiments of the present disclosure use the sapphire. The light emitting stack layer 32 includes a first conductive-type semiconductor layer 310, an active layer 312 and a second conductive-type semiconductor layer 314. The material of the light emitting stack layer 32 contains at least one element selected from the group consisting of Al, Ga, In, As, P, and N, such as GaN, AlGaInP or any other suitable materials.

In addition, the light emitting device 300 includes at least a transparent conductive oxide layer 38 formed on the light emitting stack layer 32 and at least an electrode 40 formed on the transparent conductive oxide layer 38; wherein the material of the transparent conductive oxide layer 38 comprises one or more materials selected from a group consisting of ITO, InO, SnO, CTO, ATO, AZO and ZnO.

Figure 5:
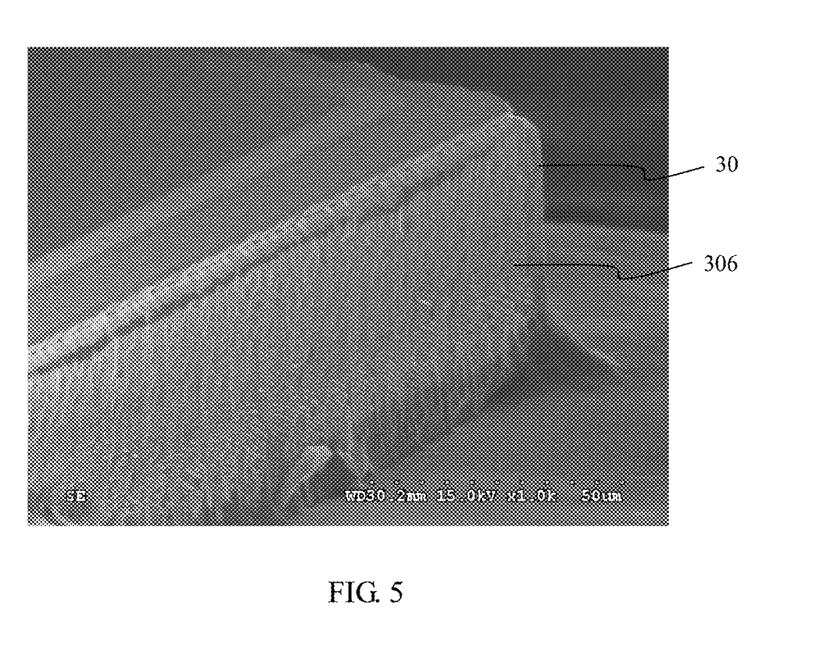
FIG. 5 illustrates a scanning electron microscope (SEM) picture of an embodiment in the present disclosure.

FIG. 5 illustrates a Scanning Electron Microscope (SEM) picture of an embodiment in the present disclosure. As the picture shows, the sidewall 306 of the substrate 30 is a substantially textured surface.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A light emitting device, comprising:
   a substrate, wherein the substrate comprises a first major surface, a second major surface opposite to the first major surface, and a sidewall wherein the entire sidewall is a substantially textured surface with a depth of between about 50 μm and 150 μm; and
   a stack of semiconductor epitaxial layers formed on the substrate.

2. The light emitting device of claim 1, wherein the textured surface is a convex-concave structure or continuous roughed surface.

3. The light emitting device of claim 2, wherein the extension direction of the convex-concave structure is longitudinal.

4. The light emitting device of claim 3, wherein the extension direction can be a direction originating from the first major surface of the substrate and heading to the second major surface of the substrate.

5. The light emitting device of claim 3, further comprising an electrode formed on the light emitting stack.

6. The light emitting device of claim 5, further comprising a transparent conductive oxide layer formed between the electrode and the light emitting stack.

7. The light emitting device of claim 1, wherein the stack of semiconductor epitaxial layers comprises:
   a first conductive-type semiconductor layer formed on the first major surface of the substrate;
   an active layer formed on the first conductive-type semiconductor layer; and
   a second conductive-type semiconductor layer formed on the active layer.

8. The light emitting device of claim 7, wherein the upper surface of the second conductive-type semiconductor layer is a substantially textured surface.

9. The light emitting device of claim 1, wherein the first major surface is a substantially textured surface.

10. The light emitting device of claim 1, wherein all of the sidewall is the substantially textured surface.

11. A light emitting device, comprising:
    a substrate, wherein the substrate comprises a first major surface, a second major surface opposite to the first major surface, and a sidewall wherein the entire sidewall is a substantially textured surface with a depth of between about 50 μm and 150 μm and the textured surface is with an extension direction and forms an angle θ with the first major surface of the substrate, herein $0°<θ<90°$; and
    a stack of semiconductor epitaxial layers formed on the substrate.

12. The light emitting device of claim 11, wherein the extension direction can be a direction originating from the first major surface of the substrate and heading to the second major surface of the substrate.

13. The light emitting device of claim 11, wherein the textured surface is a convex-concave structure or continuous roughed surface.

14. The light emitting device of claim 11, wherein the stack of semiconductor epitaxial layers comprises:
    a first conductive-type semiconductor layer formed on the first major surface of the substrate;
    an active layer formed on the first conductive-type semiconductor layer; and
    a second conductive-type semiconductor layer formed on the active layer.

15. The light emitting device of claim 14, wherein the upper surface of the second conductive-type semiconductor layer is a substantially textured surface.

16. The light emitting device of claim 11, further comprising an electrode formed on the light emitting stack.

17. The light emitting device of claim 16, further comprising a transparent conductive oxide layer formed between the electrode and the light emitting stack.

18. The light emitting device of claim 11, wherein the first major surface is a substantially textured surface.

19. The light emitting device of claim 11, wherein all of the sidewall is the substantially textured surface.

* * * * *